(12) United States Patent
Kishino et al.

(10) Patent No.: US 8,896,100 B2
(45) Date of Patent: Nov. 25, 2014

(54) III NITRIDE STRUCTURE AND METHOD FOR MANUFACTURING III NITRIDE SEMICONDUCTOR FINE COLUMNAR CRYSTAL

(75) Inventors: Katsumi Kishino, Chiyoda-ku (JP); Akihiko Kikuchi, Chiyoda-ku (JP)

(73) Assignee: Sophia School Corporation, Tokyo (JP)

( * ) Notice: Subject to any disclaimer, the term of this patent is extended or adjusted under 35 U.S.C. 154(b) by 469 days.

(21) Appl. No.: 12/676,061

(22) PCT Filed: Aug. 27, 2008

(86) PCT No.: PCT/JP2008/002322
§ 371 (c)(1), (2), (4) Date: Mar. 2, 2010

(87) PCT Pub. No.: WO2009/031276
PCT Pub. Date: Mar. 12, 2009

(65) Prior Publication Data
US 2010/0193910 A1 Aug. 5, 2010

(30) Foreign Application Priority Data
Sep. 3, 2007 (JP) .................. 2007-227935

(51) Int. Cl.
*H01L 29/20* (2006.01)
*H01L 21/02* (2006.01)
*C30B 29/60* (2006.01)
*C30B 23/00* (2006.01)
*C30B 29/40* (2006.01)

(52) U.S. Cl.
CPC ...... *H01L 21/02642* (2013.01); *H01L 21/0254* (2013.01); *H01L 21/02381* (2013.01); *C30B 29/60* (2013.01); *H01L 21/02433* (2013.01); *H01L 21/02603* (2013.01); *C30B 23/00* (2013.01); *C30B 29/403* (2013.01)

USPC .............. 257/615; 257/E29.089; 257/E21.09; 257/103; 257/201

(58) Field of Classification Search
CPC ............ H01L 21/0254; H01L 21/0262; H01L 29/2003; H01L 21/02458; C30B 29/403
USPC ........ 257/79, 88, 94, 103, E33.005, E33.006; 438/22
See application file for complete search history.

(56) References Cited

U.S. PATENT DOCUMENTS

2006/0060832 A1* 3/2006 Symanczyk et al. .............. 257/3
2006/0172512 A1 8/2006 Hiramatsu et al.
(Continued)

FOREIGN PATENT DOCUMENTS

| CN | 1759469 A | 4/2006 | |
|---|---|---|---|
| JP | 2007-131527 A | 5/2007 | |
| WO | WO 2006025407 A1 * | 3/2006 | .............. H01S 5/183 |

OTHER PUBLICATIONS

Ishizawa et al. ("Selective Growth of GaN nanocolumns by Al thin layer on substrate" phys. Stat. Sol. (b) 244, No. 6, 1815-1819 (2007)).*

(Continued)

*Primary Examiner* — Thao X Le
*Assistant Examiner* — Long Le
(74) *Attorney, Agent, or Firm* — Sughrue Mion, PLLC

(57) ABSTRACT

A III nitride structure includes a film 108 having a surface composed of a metal formed in a predetermined region on the surface of a substrate 102, and a fine columnar crystal 110 composed of at least a III nitride semiconductor formed on the surface of the substrate 102, wherein the spatial occupancy ratio of the fine columnar crystal 110 is higher on the surface of the substrate 102 where the film 108 is not formed than that on the film.

29 Claims, 10 Drawing Sheets

(56) References Cited

U.S. PATENT DOCUMENTS

| | | | |
|---|---|---|---|
| 2007/0248132 A1* | 10/2007 | Kikuchi et al. | 372/44.01 |
| 2008/0036038 A1* | 2/2008 | Hersee et al. | 257/615 |
| 2010/0252836 A1* | 10/2010 | Kishino et al. | 257/76 |

OTHER PUBLICATIONS

Kishino et al. ("Position Control of GaN nanocolumns by selective area growth on patterned substrates", MBE '08, Jun. 6-7, 2008).*

Kishino et al. ("Selective-area growth of GaN nanocolumns on titanium-mask-patterned silicon (111) substrates by RF-plasma-assisted molecular-beam epitaxy", Electronics Letters, Jun. 19, 2008, vol. 44, No. 13).*

Ishizawa et al. ("Selective Growth of GaN nanocolumns by Al thin layer on substrate", phys. stat. sol.(b) 244, No. 6, 1815-1819 (2007) (No Month cited)).*

Sekiguchi et al. ("Structural and Optical properties of GaN nanocolumns grown on (0001) sapphire substrates by rf-plasma-assisted molecular-beam epitaxy", J. of Crystal Growth, 300 (2007), 259-262 (Jan. 17, 2007)).*

Masaki Yoshizawa, et al., "Growth of Self-Organized GaN Nanostructures on $Al_2O_3$(0001) by RF-Radical Source Molecular Beam Epitaxy," Jpn. J. Appl. Phys., Apr. 15, 1997, pp. L459-L462, vol. 36, Part 2, No. 4B.

Shunsuke Ishizawa, et al., "Selective Growth of GaN Nanocolumns by an Al Thin Film Pattern," Extended Abstracts, The Japan Society of Applied Physics, Aug. 29, 2006, p. 314, vol. $67^{th}$, No. 1 (29a-E-1).

Shunsuke Ishizawa, et al., "Selective Growth of GaN Nanocolumn by an Al Nano-Pattern," Extended Abstracts, The Japan Society of Applied Physics, Mar. 27, 2007, p. 382, vol. $54^{th}$, No. 1 (28a-ZC-7).

OT. Hoshino, et al., "Selective Growth of a GaN Nanocolumn by a Ti Micro Pattern," Extended Abstracts, The Japan Society of Applied Physics, Sep. 4, 2007, p. 350, vol. $68^{th}$, No. 1 (4p-S-3).

Hiroto Sekiguchi, et al., "Structural and Optical Properties of GaN Nanocolumns Grown on (0001) Sapphire Substrates by RF-Plasma-Assisted Molecular-Beam Epitaxy," Journal of Crystal Growth, 2007, p. 259-262, vol. 300.

H. Tang, et al., "Si (111) Substrates as Highly Effective Pseudomasks for Selective Growth of GaN Material and Devices by Ammonia-Molecular-Beam Epitaxy," Applied Physics Letters, 2006, pp. 172110-1-172110-3, vol. 88.

Thomas Mårtensson, et al., "Nanowire Arrays Defined by Nanoimprint Lithography," Nano Letters, 2004, pp. 699-702, vol. 4, No. 4.

* cited by examiner (a)

(b)

(a) (b)

(a)   (b)

(a) (b)

(a) (b)

(a)

(b)

(c)

(d)

(a)  (b)

(a)  (b)

III NITRIDE STRUCTURE AND METHOD FOR MANUFACTURING III NITRIDE SEMICONDUCTOR FINE COLUMNAR CRYSTAL

CROSS REFERENCE TO RELATED APPLICATIONS

This application is a National Stage of International Application No. PCT/JP2008/002322 filed Aug. 27, 2008, claiming priority based on Japanese Patent Application No. 2007-227935, filed Sep. 3, 2007, the contents of all of which are incorporated herein by reference in their entirety.

TECHNICAL FIELD

The present invention relates to a III nitride structure and a method for manufacturing a III nitride semiconductor fine columnar crystal.

BACKGROUND ART

In recent years, III nitride such as gallium nitride (GaN) has been paid attention as an element that can realize a high-quality short-wavelength light emitting diode and a laser diode. There are many problems to be solved in putting electronic devices and others utilizing such a III nitride structure into practical use.

The growth technique of semiconductor crystal, for example, the epitaxial technique, the MOCVD (Metal Organic Chemical Vapor Deposition) technique, and others provide a controllability in the lamination direction; however, in order to make a structure in the in-plane direction, processing must be carried out using a different technique. The crystal processing techniques may be roughly classified into the top-down type in which the crystal is processed after the crystal growth and the bottom-up type in which the substrate is processed before the crystal growth and the structure is fabricated simultaneously with the crystal growth. By the top-down type, damages are given to the crystal by the processing, so that a problem arises particularly in a fine structure because the surface area will be large. On the other hand, the fabrication method for the bottom-up type can in many cases ensure both the controllability of the structure and the crystal quality.

In relation to the nitride semiconductor, there is a method for using a mask of silicon oxide or the like as a technique for fabricating a fine structure of the bottom-up type. This method in which the crystal is grown selectively in the opening of the mask that is patterned on the substrate is practically used in the vapor deposition method. However, by the molecular beam epitaxy method (which will be hereafter abbreviated as MBE), the polycrystal will be deposited on the mask.

M. Yoshizawa and others have found out a method for forming a gallium nitride crystal having a fine columnar shape with a diameter of about 100 nm in a self-organizing manner by growing gallium nitride under a condition of excessive nitrogen in the MBE using activated nitrogen excited by high-frequency plasma as a nitrogen source (See the non-patent document 1).

Further, H. Sekiguchi and others report that the diameter, the density, and the independence of gallium nitride fine columnar crystal that grows on a sapphire substrate with thin film aluminum nitride serving as a buffer layer are largely dependent on the surface morphology of the buffer layer (See non-patent document 1). The thin film aluminum nitride buffer layer grows into a shape having unevenness. The morphology thereof is dependent on the film thickness, and there is a tendency such that, when the film thickness is small, numerous small grains are formed, whereas when the film thickness is large, the grain size will be large. Further, the columnar gallium nitride crystal that has grown thereon has a tendency such that, according as the film thickness of aluminum nitride becomes large, the columnar gallium nitride crystals will have a small diameter and will be independent from each other. In the above report, a sapphire substrate is used. However, with regard to the other substrates as well, the morphology of the buffer layer and the shape of the columnar crystal that has grown thereon are greatly related with each other.

H. Tang and others have grown GaN selectively on a thin film AlN by fabricating a resist pattern using a photo-exposure technique after thin film AlN of 25 nm is fabricated on a Si(111) substrate by using the MBE method using ammonia as the crystal growth method, fabricating a pattern of AlN by selectively etching the thin film AlN, and further growing the crystal of GaN using the ammonia MBE method, and have verified that GaN does not grow in the part where AlN has been removed (See non-patent document 3). It is shown that, in the ammonia MBE, the growth nucleus forming temperature of GaN is higher on the AlN than on the Si, so that selective growth of GaN can be realized when the growth is carried out at a suitable temperature.

T. Martensson and others use particulate Au patterned on an InP substrate as a catalyst and fabricate an InP nano-wire with a controlled shape by regular arrangement through VLS mode growth (See patent document 4).

Non-Patent Document 1: M. Yoshizawa, A. Kikuchi, M. Mori, N. Fujita, and K. Kishino, Jpn. J. Appl. Phys. Vol. 36 (1997), pp. L459-L462

Non-Patent Document 2: H. Sekiguchi, T. Nakazato, A. Kikuchi, and K. Kishino, Journal of Crystal Growth Non-Patent Document 3: H. Tang, S. Haffouz, and J. A. Bardwell, Applied Physics Letters 88. 172110 (2006)

Non-Patent Document 4: T. Martensson, P. Carlberg, M. Borgstrom, L. Montelius, W. Seifert, and L. Samuelson, Nano Letters 4, 699 (2004)

DISCLOSURE OF THE INVENTION

However, since the fine columnar crystals on a substrate grow by natural nucleus generation, so that the crystals are arranged irregularly on a substrate surface. The fine columnar crystals produced by a conventional method are varied in the position and in the shape, so that such variation in the position and in the shape seems to lead to the variation in the properties of the nitride semiconductor.

Like the method of non-patent document 2, there are numerous reports stating that the columnar crystals can be formed depending on the growth condition of the buffer layer or the growth condition of the GaN columnar crystal. However, even with use of the methods of the documents, reduction of the variation and a high-degree control such as arbitrary change of the shape and the position of the columnar crystal (for example, a photonic crystal in which defects are intentionally introduced) have been difficult.

Also, since the shape of the GaN crystal that has grown on the thin film aluminum nitride serving as a buffer layer is largely dependent on the surface morphology of the buffer layer, it is known that the position and the shape of the crystal can be controlled by the patterning of the buffer layer. However, in patent document 3, a GaN crystal in a film form is grown, so that the crystal is not a columnar crystal. Also, by the method shown in patent document 3, the crystal growth for two times is needed, so that it is a cumbersome method.

Therefore, reduction of the variation in the position and the shape is a goal to be achieved for the purpose of device application of the fine columnar crystal of the III nitride semiconductor. Conventionally, however, under a condition of growing a fine columnar crystal of nitride semiconductor, it has been difficult to control the position and the shape of the crystal by a simple method.

The present invention has been made in view of the above circumstances, and an object thereof is to achieve the control of the position and the shape of a fine columnar crystal by selectively growing the fine columnar crystal of the III nitride semiconductor.

The present inventors have made eager studies on the growth position and shape control of nanometer order fine columnar crystal (which may also be referred to as a nanocolumn, a nanorod, or a nanopillar) composed of the III nitride semiconductor, and have found out that the growth of the fine columnar crystal can be controlled by forming a film having a surface made of a metal on the substrate as a step previous to the crystal growth, thereby completing the present invention.

Namely, the present invention relates to a III nitride structure including a film having a surface composed of a metal formed in a predetermined region on the surface of a substrate, and a fine columnar crystal composed of at least a III nitride semiconductor formed on the surface of the substrate, wherein the spatial occupancy ratio of the fine columnar crystal on the surface of the substrate where the film is not formed is higher than that on the film.

In other words, the growth of a III nitride semiconductor fine columnar crystal can be highly controlled by forming a metal film pattern in advance on a substrate and suppressing the growth of the fine columnar crystal on the metal film pattern.

Also, the present invention relates to a method for manufacturing a fine columnar crystal including forming a film having a surface made of a metal in a predetermined region on a surface of a substrate, and growing a fine columnar crystal made of a III nitride semiconductor at least on the surface of the substrate where the film is not formed, by introducing a growth source material to the surface of the substrate, assuming the region on the film to be a growth suppressing region, and suppressing the growth of the fine columnar crystal made of the III nitride semiconductor on the growth suppressing region.

On the growth suppressing region, the growth of the fine columnar crystal is suppressed as compared with other regions. Therefore, the fine columnar crystal may be selectively grown only on the regions excluding the growth suppressing region. Or else, on the growth suppressing region, the fine columnar crystal grows more coarsely as compared with other regions.

According to the present invention, in the regions on the film having a surface made of a metal, the growth of the fine columnar crystal composed of III nitride semiconductor is suppressed. Therefore, control of the position and the shape of a fine columnar crystal composed of III nitride semiconductor can be realized by forming a pattern of a metal film.

BRIEF DESCRIPTION OF THE DRAWINGS

The above objects as well as other objects, features, and advantages will be made further clearer by a suitable embodiment described below and the following drawings associated therewith.

FIG. 8(a) is an observation view from immediately above and FIG. 8(b) is an observation view from obliquely above.

FIG. 9(a) is a view with a hole interval of 1000 nm, FIG. 9(b) is a view with a hole interval of 600 nm, FIG. 9(c) is a view with a hole interval of 400 nm, and FIG. 9(d) is a view with a hole interval of 300 nm.

FIG. 10(a) is an observation view from immediately above and FIG. 10(b) is an observation view from obliquely above.

FIG. 11(a) is an observation view from immediately above and FIG. 11(b) is an observation view from obliquely above.

FIG. 12(a) is an observation view from immediately above and FIG. 12(b) is an observation view from obliquely above.

BEST MODE FOR CARRYING OUT THE INVENTION

Figure 1:
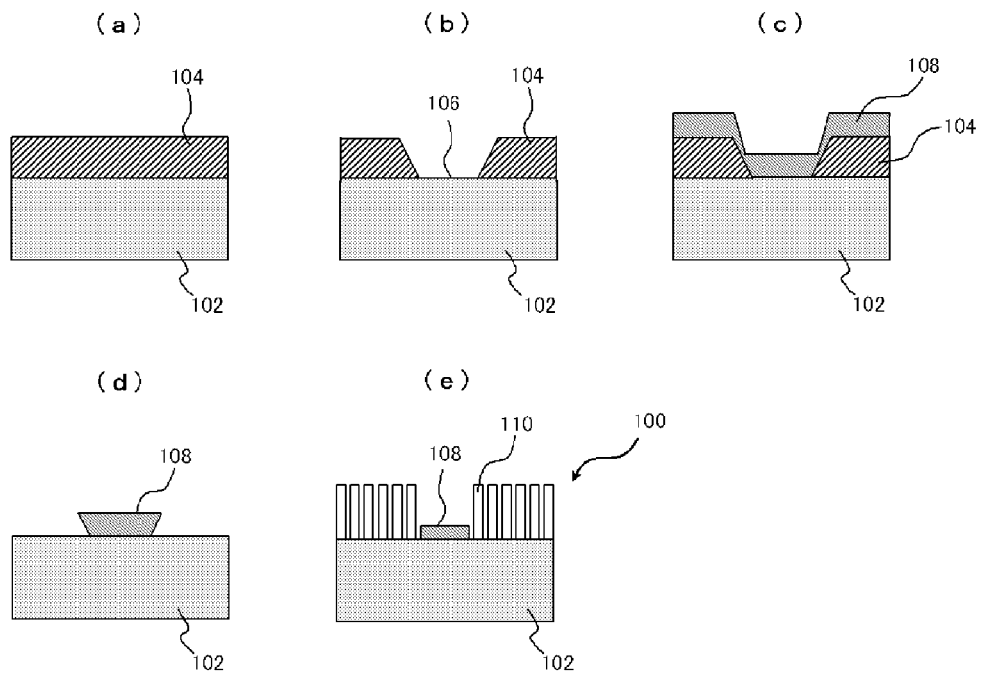
FIG. 1 is a cross-sectional view showing a summary of the growth process of a GaN fine columnar crystal.

Hereafter, an embodiment of the present invention will be described with reference to the drawings.

As shown in FIG. 1(e), a III nitride structure 100 in the present embodiment includes a film 108 having a surface composed of a metal formed in a predetermined region on the surface of a substrate 102, and includes a fine columnar crystal 110 composed of a III nitride semiconductor formed at least on the surface of the substrate 102 where the film 108 is not formed. Further, the fine columnar crystals 110 are formed more densely on the surface of the substrate 102 where the film 108 is not formed than on the film 108. In the present embodiment, an aspect in which the fine columnar crystal 110 is not formed on the film 108 will be described.

With reference to FIGS. 1(a) to 1(e), a method for producing a fine columnar crystal in the present embodiment will be described.

First, a film having a surface made of a metal is formed in a predetermined region on the surface of a substrate. In the step of forming the film having a surface made of a metal, for example, after the top of a silicon substrate 102 is coated with a photoresist 104, a pattern is formed in a predetermined region by using a photo-exposure technique.

Specifically, first, a solution of a resist material is applied onto the surface of a silicon substrate 102, followed by drying to form a photoresist film 104 (FIG. 1(a)). In the present embodiment, single crystal silicon is used as the substrate 102. Thereafter, exposure to light is carried out with use of a photo-exposure apparatus, and development and rinsing are carried out to perform patterning, thereby to form a groove 106 at a desired position (FIG. 1(b)). The cross-sectional shape of the groove 106 in the present embodiment is set to be an inverse taper shape in which the width becomes smaller as it approaches the groove bottom part as shown in FIG. 1(b); however, the shape is not limited thereto, so that the shape may be a taper shape in which the width becomes larger as it approaches the groove bottom part or may be a rectangular shape in which the bottom surface and the side surface of the groove are perpendicular to each other. Next, a metal film 108 is vapor-deposited on the whole surface of the substrate including the groove 106 (FIG. 1(c)). There are cases in which the metal film 108 is not vapor-deposited on the side surface of the groove 106.

After the metal film 108 is formed, the photoresist film 104 is removed thereby to remove the metal film 108 formed thereon at the same time (lift-off method). By this, the metal film 108 is formed in a predetermined region on the substrate surface (FIG. 1(d)).

The metal film 108 includes, for example, one kind of metal or two or more kinds of metals selected from the group consisting of metals having a silicide forming function and metals without having a silicide forming function. It is assumed that the metal does not include those made of silicon alone but includes those in which a silicide is formed by diffusion of the silicon of the substrate into the metal. The metal having a silicide forming function used in the present embodiment may be, for example, one kind of metal or two or more kinds of metals selected from the group consisting of Ti, Ta, Fe, Ni, Co, and W. Also, the metal without having a silicide forming function used in the present embodiment may be, for example, one kind of metal or two or more kinds of metals selected from the group consisting of Pt and Au. Among these metals, Ti, Pt, Ni, and Au are preferable in view of controlling the growth of the fine columnar crystal.

By using a metal such as described above, the growth of the fine columnar crystal on the metal film 108 can be suppressed with certainty.

Here, for example, when a Ti film or the like is formed as the metal film 108, the Ti film or the like may be oxidized so as to form a metal oxide layer on the surface. Even in this case, the growth of the fine columnar crystal on the metal film 108 can be suppressed with certainty.

For example, the metal film 108 may be a film containing titanium oxide at least on the surface. The metal film 108 may be such that the surface layer is a layer containing titanium oxide and the lower layer positioned below the surface layer is a titanium layer or a titanium nitride layer. Alternatively, the whole metal layer 108 may be a titanium oxide layer.

By using such a metal film 108, the growth of the fine columnar crystal on the metal film 108 can be suppressed with certainty as well.

Here, the metal film 108 containing titanium oxide in the surface may be formed in the following manner. The metal film 108 containing titanium oxide in the surface may be formed, for example, by nitriding a titanium layer to form a titanium nitride and naturally oxidizing this titanium nitride.

Figure 2:
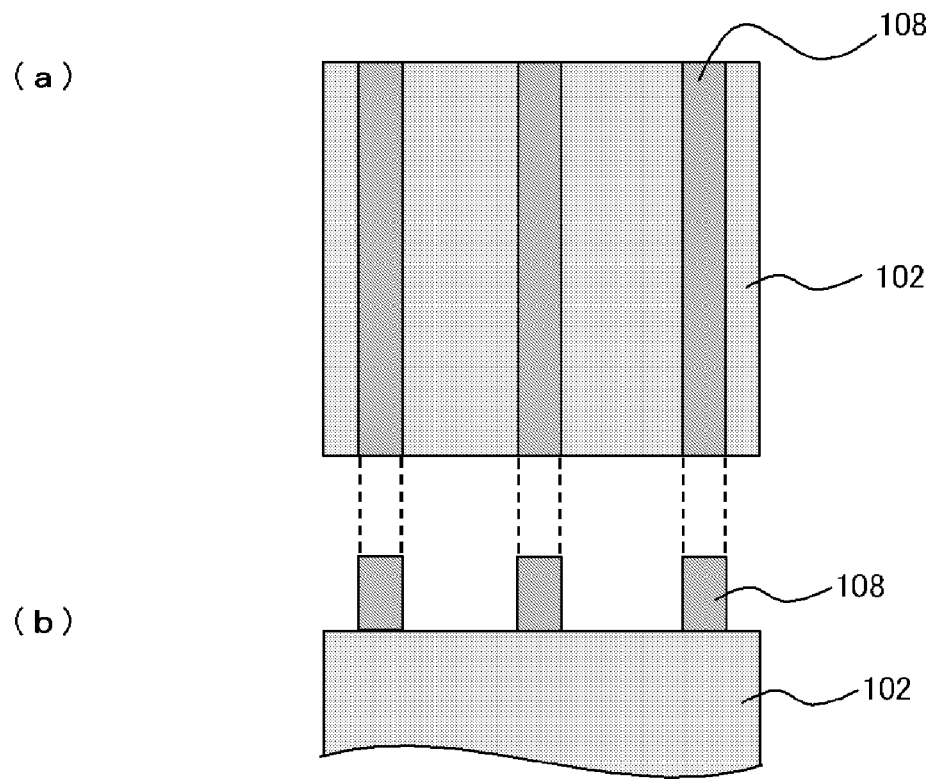
FIG. 2(a) is a plan view and FIG. 2(b) is a cross-sectional view showing an example of a metal film pattern.

The metal film 108 can be formed with a predetermined pattern in a predetermined region. The predetermined pattern shape is not particularly limited; however, the shape may be, for example, a stripe shape, a dot shape, a ring shape, a mesh shape, or a hole pattern shape. The stripe shape may be one such that the metal film 108 is formed in a stripe shape on the substrate 102, such as shown in FIGS. 2(a) and 2(b). FIG. 2(a) is a plan view in which the substrate is viewed from an upper side, and FIG. 2(b) is a cross-sectional view of the substrate. Further, the stripe shape may be, for example, an inverse pattern of FIG. 2, namely, a shape in which the metal film 108 is formed on the whole substrate 102, and slits are formed in a stripe shape in the metal film 108 (FIGS. 3(a) and 3(b)), or the like. The dot shape may be, for example, a shape in which a metal film having a dot shape is arranged in an oblique lattice form or in a square lattice form. The dot shape may be a polygonal shape such as a quadrangle or a hexagon besides a circular shape. Also, the hole pattern may be, for example, a shape in which the exposed part of the substrate and the metal film part in the above dot pattern are reversely arranged.

The line width or diameter of the metal film 108 having a stripe shape, a dot shape, or the like and the line width or diameter of the opening of the slit, the hole, or the like are not particularly limited; however, the line width or diameter can be, for example, 20 nm or more and 3 μm or less.

Returning to FIG. 1, after the metal film 108 is formed, a growth source material is introduced to the surface of the substrate 102, so as to grow a fine columnar crystal 110 made of gallium nitride (GaN) as a III nitride semiconductor. Here, the region on the metal film 108 will be referred to as a growth suppressing region of the fine columnar crystal. With the region on the metal film 108 serving as a growth suppressing region, the growth of the fine columnar crystal 110 is suppressed on the metal film 108. As shown in FIG. 1(e), in the present embodiment, with use of the metal film 108 serving as a mask, the fine columnar crystal 110 is formed selectively on only the surface of the substrate 102 where the metal film 108 is not formed.

For the growth of the fine columnar crystal, the MBE method is used in the present embodiment. Onto the substrate surface, activated nitrogen excited by high-frequency plasma and a growth gas containing a group III metal described above are simultaneously introduced as the growth source material, thereby to grow the fine columnar crystal. The growth condition at this time is set to be such that the effective supply amount ratio of activated nitrogen is increased as compared with the group III metal, so as to provide a condition by which the columnar crystal will grow.

For example, in the case of GaN, when the crystal growth temperature is set to be 600° C. or lower, the GaN crystal often grows also in the growth suppressing region. On the other hand, as the growth temperature is increased, the spatial density of GaN that grows in the growth suppressing region will decrease. Eventually, GaN may not be grown in the growth suppressing region. The growth temperature at which GaN is not grown in the growth suppressing region depends also on the supply amount and the ratio of III metal and activated nitrogen; however, the growth temperature is, for example, 850° C. or higher.

In order to grow the columnar crystal, the MBE is preferably carried out under the following condition. The temperature is suitably selected according to the kind of III nitride semiconductor that is grown; however, the temperature is within a range of 350° C. or higher and 1200° C. or lower. For example, in the case of GaN, the temperature is preferably 400° C. or higher and 1000° C. or lower. In the case of AlN, the temperature is preferably 500° C. or higher and 1200° C. or lower. In the case of InN, the temperature is preferably 350° C. or higher and 600° C. or lower. By performing the MBE within the above temperature range and under a nitrogen-rich condition, the fine columnar crystal of nitride semiconductor can be grown.

As described above, the growth of the fine columnar crystal 110 is suppressed in the region on the metal film 108, and the fine columnar crystal 110 is not formed. Since the growth of the fine columnar crystal 110 is suppressed in the above growth suppressing region, the position and the shape of the fine columnar crystal 110 can be controlled by forming the metal film 108 containing the above metal in a desired pattern on the substrate 102.

In the above embodiment, a case has been described in which the GaN fine columnar crystal is not grown on the growth suppressing region, and the fine columnar crystal is selectively grown only on the substrate surface where the metal film is not formed. However, the fine columnar crystal may be formed on the growth suppressing region. In this case also, the growth of the fine columnar crystal is suppressed on the growth suppressing region. In other words, the suppression as referred herein includes a case in which the fine columnar crystal is formed spatially more coarsely, namely the fine columnar crystal is formed at a lower spatial occupancy ratio, as compared with other regions, and a case in which the fine columnar crystal is not formed at all. Then, the case in which the fine columnar crystal is formed at a lower spatial occupancy ratio as compared with other regions includes, for example, a case in which the surface occupancy ratio of the fine columnar crystal is lower as compared with other regions, a case in which the height of the fine columnar crystal is lower as compared with other regions and a case in which both of the above occurs.

In this case as well, those similar to the above metal film 108 can be used. Also, in any of the cases, the fine columnar crystal can assume various shapes described below.

The reason why the above range is set to be the growth suppressing region is not necessarily clear, and does not go beyond the range of conjecture; however, the reason is as follows. The fine columnar crystal grows at least on the substrate surface where the metal film is not formed, and the growth of the fine columnar crystal is suppressed on the metal film. The reason why the fine columnar crystal grows in this manner is not necessarily clear. However, it is conjectured that elimination of gallium (Ga) or the like is promoted more on the surface of the metal film 108 than on the silicon substrate 102. When the substrate temperature during the growth of the fine columnar crystal 110 is observed by an infrared radiation thermometer, it has been confirmed that the temperature is higher on the metal film 108 than on the silicon substrate 102. Although it is not necessarily clear, it seems that the period of time from the surface diffusion to evaporation of the supplied Ga atoms or the like, for example, is made shorter on the metal film 108, and the total number of Ga atoms that are involved in the crystallization decreases as compared with that on the silicon substrate 102. As a result of this, it seems that the growth of the fine columnar crystal 110 is suppressed on the metal region 108 than in the other regions.

Also, it is considered that the kind of the metal vapor-deposited on the substrate affects the suppression greatly. With regard to the metals having a silicide-forming function, it is considered that, when a silicon substrate is used under a growth condition of III nitride fine columnar crystal, silicon is diffused into the metal film, and also migrates onto the film surface. Although it is not clear, it is conjectured that, by forming a silicide, the growth of the fine columnar crystal on the metal film surface is suppressed. Or else, when attention is paid to the physical property of Ti and Pt, these have a high melting point and a high boiling point as compared with other metals; the bonding energy per covalent bond is high; and the thermal conductivity is low as compared with other metals. Ti and Pt have a smaller number of non-bonded hands on the surface because of the strength of the covalent bond. For such a reason, it is conjectured that the facility of bonding cannot be expected, and the start of the growth of the III nitride fine columnar crystal was suppressed.

Also, in the crystal growth step, activated nitrogen is radiated either alone or together with a III metal onto the metal film surface. In the case of a metal having a nitride forming function, it is conjectured that a metal nitride (for example, TiN, WN, or the like) is formed. These metal nitrides are chemically stable, namely there are a small number of active non-bonded hands on the surface, so that the bonding with Ga or GaN is weak. Therefore, it is also considered that, in the case of a growth temperature sufficient for Ga, GaN, or the like to be eliminated from the surface, the supplied Ga or GaN is eliminated before coming to have a size sufficient for the crystal growth to be maintained, whereby the growth of GaN is suppressed.

From the above, in particular, a synergistic effect of the fact that the temperature in the growth suppressing region is higher than that in the substrate surface and the fact that the growth nucleus of GaN is hardly formed on the growth suppressing region can be expected.

On the other hand, on the surface where the silicon substrate 102 is exposed, on which the metal film 108 is not formed, the suppression of the crystal growth does not occur. As a result, the fine columnar crystals 110 are formed spatially more densely on the exposed surface of the silicon substrate 102 than on the metal film 108. The fine columnar crystal formed on the substrate and on the metal film surface may change by being dependent on the kind of the substrate or the metal, the metal film thickness, the growth condition, and the like; however, the fine columnar crystal grows upright approximately in the perpendicular direction relative to the substrate or the metal film surface.

The fine columnar crystal grown on the growth suppressing region has an approximately equal or smaller height than the fine columnar crystal grown on the region other than the growth suppressing region. The ratio of the height of the fine columnar crystal grown on the growth suppressing region relative to the height of the fine columnar crystal grown on the region other than the growth suppressing region is not particularly limited; however, the ratio is, for example, 0.0 or more and 0.95 or less, more preferably 0.0 or more and 0.7 or less.

The fine columnar crystal made of III nitride semiconductor that grows by the method of the present embodiment is a single crystal of a columnar structure having a cross-section with a size of nanometer order, and may in some cases be referred to as a nanocolumn, a nanorod, or a nanopillar. Typically, the fine columnar crystal grows upright approximately in the perpendicular direction to the substrate surface. The cross-sectional shape, the diameter, the height, and the like of the crystal may vary according to the growth condition of the crystal; however they are typically as follows.

The cross-sectional shape of the fine columnar crystal may be, for example, a fine columnar crystal having a hexagonal shape, a C-letter shape, an L-letter shape, a generally circular shape, an elliptical shape, or a shape in which a number of generally circular columnar crystals are combined. The diameter of the fine columnar crystal is not particularly limited; however, the diameter is, for example, 10 nm or more and 1000 nm or less. Above all, the diameter is preferably 700 nm or less, more preferably 650 nm or less, still more preferably 600 nm or less. When the diameter is set to be 700 nm or less, in particular, 600 nm or less, generation of penetration dislocation may be easily suppressed.

Figure 10:
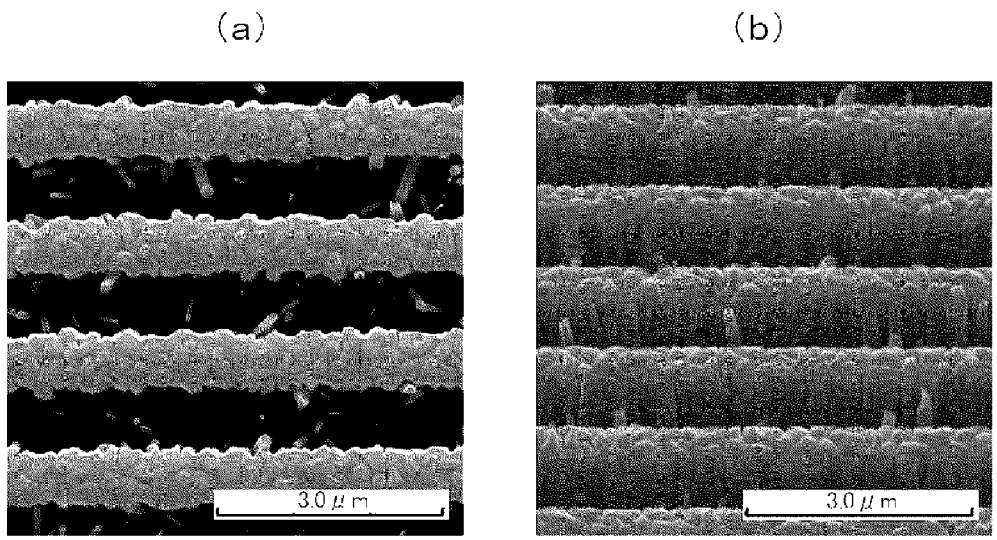
FIG. 10 is a view showing an SEM image of a GaN fine columnar crystal that has been formed with a stripe pattern in a wall shape on a silicon substrate, where
Figure 11:
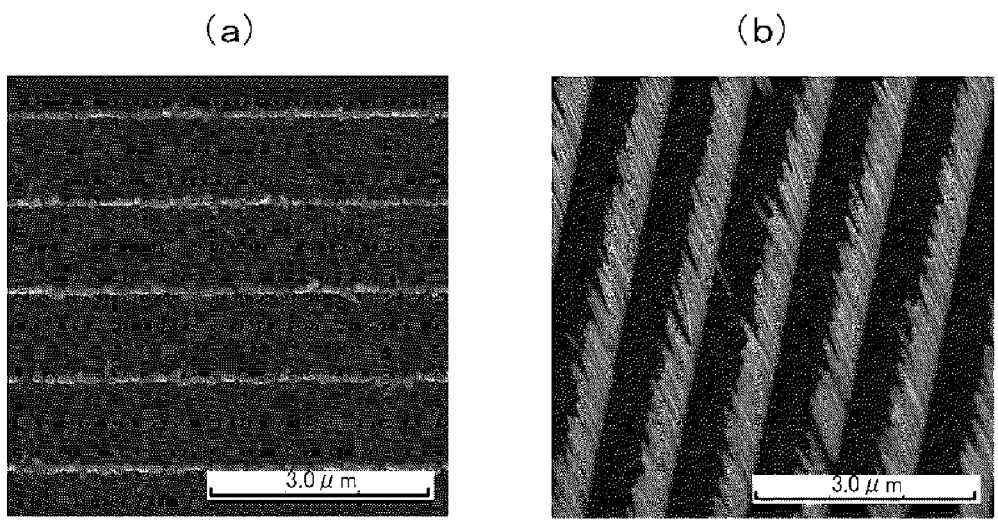
FIG. 11 is a view showing an SEM image of a series of GaN fine columnar crystals that have been formed with a stripe pattern in a wall shape on a silicon substrate, where
Figure 12:
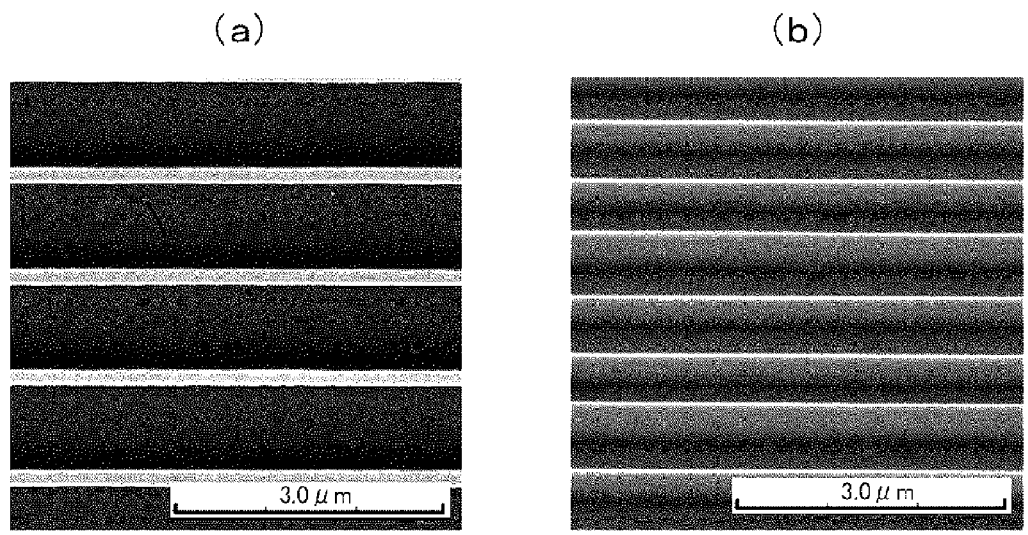
FIG. 12 is a view showing an SEM image of a GaN fine columnar crystal that has been formed with a stripe pattern in a wall shape on a GaN template, where
Figure 13:
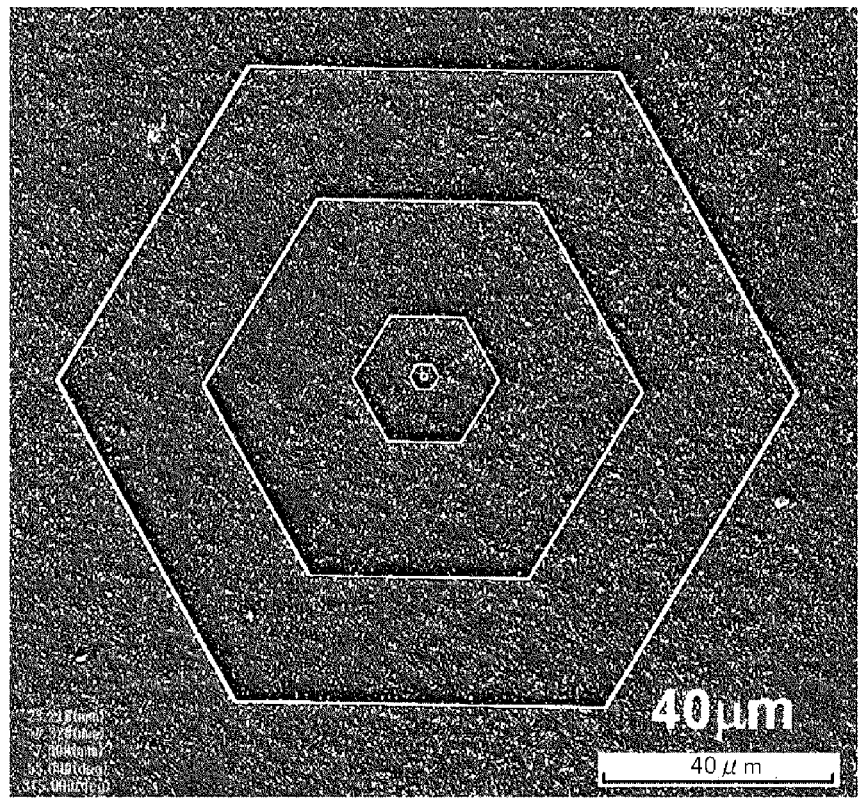
FIG. 13 is a view showing an SEM image of a GaN fine columnar crystal that has been formed with a ring pattern in a wall shape on a GaN template.
Figure 14:
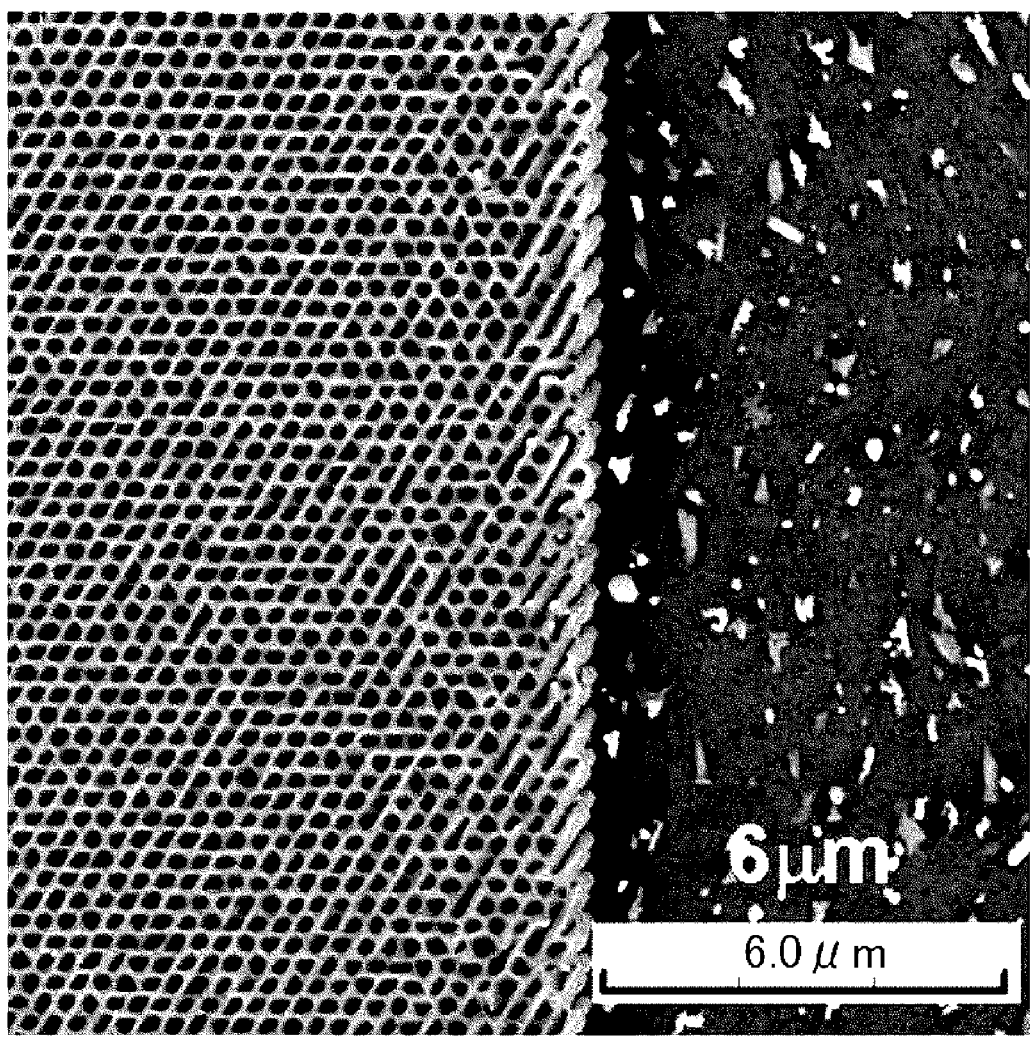
FIG. 14 is a view showing an SEM image of a GaN fine columnar crystal that has been formed in a mesh shape on a GaN template.

The fine columnar crystal may be various shapes. The fine columnar crystal may be formed in various patterns by controlling the pattern shape of the opening that is formed in the metal film. For example, the fine columnar crystal may be a wall-shaped fine columnar crystal. Examples of the wall-shaped crystal include a stripe shape such as shown in FIGS. 10, 11, and 12, a ring shape such as shown in FIG. 13, a mesh structure such as shown in FIG. 14. Here, the fine columnar crystal formed in a wall shape may be formed as a connection of a plurality of columnar crystals that is referred to as nanocolumns (for example, FIGS. 10 and 11). Namely, it includes one in which a plurality of independent fine columnar crystals are disposed to be arranged in one direction and have grown to have a wall shape. Though the plurality of fine columnar crystals is independent, adjacent crystals may be spaced apart from each other or connected. Further, a single fine columnar crystal may be formed in a wall shape (for example, FIGS. 12 and 13). In other words, it may have a wall shape that extends in one direction in a top view. Further, the fine columnar crystal may have a mesh-like shape in a top view. The width of the wall-shaped fine columnar crystal is, for example, 20 nm or more and 800 nm or less. Above all, the width of the wall-shaped fine columnar crystal is preferably 600 nm or less. Further, the length of the wall-shaped fine columnar crystal can be set according to a desired metal film pattern and is, for example, 100 nm or more and several cm or less.

The height of the fine columnar crystal is not particularly limited and is, for example, 0.2 μm or more and 5 μm or less, though the height may vary according to the thickness of the metal film, the crystal growth condition, and the like.

However, the above numerical values and others are exemplifications, and the shape of the fine columnar crystal may vary in complex relation to the kind of the substrate or the metal film, the metal film thickness, the crystal growth condition, and the like The metal film thickness is not particularly limited; however, it is preferably 2 nm or more and 100 nm or less.

The present invention as described above is applicable in the field of electronic devices and optical devices. The fine columnar crystal has an excellent light-emitting property, and application to the light-emitting devices is expected. Also, application to the technique of biochips and others may be considered.

As described above, the embodiment of the present invention have been described with reference to the drawings; however, these are exemplifications of the present invention, so that various constructions other than the above constructions can be adopted within a range that does not depart from the gist of the present invention.

For example, in the above embodiment, description was given by raising a fine columnar crystal made of GaN as an example. However, as a constituent material of the fine columnar crystal, a III nitride semiconductor other than GaN, for example, a nitride semiconductor represented by a general formula of $Al_xGa_yIn_{1-x-y}N$ ($0 \leq x \leq 1$, $0 \leq y \leq 1$, and $0 \leq x+y \leq 1$) such as AlN, InN, AlGaN, InGaN, AlInGaN, or a boron nitride such as BN, can be used.

Also, in the above embodiment, single crystal silicon was used as a material of the substrate; however, the present invention is not limited thereto, so that a SiC, $SiO_2$, $Si_3N_4$, GaN, sapphire substrate or the like can be used.

However, in the case of using a film having a silicide-forming function described above as a metal film, it is preferable to use a substrate whose surface is formed from a layer containing silicon.

As the method for growing the fine columnar crystal, an example using the MBE was shown in the above embodiment. However, the organic metal chemical vapor deposition method (MOCVD), the organic metal vapor phase epitaxy (MOVPE) method, or the hydride vapor phase epitaxy (HYPE) method may be used.

Hereafter, Examples of the present invention will be described in more detail.

EXAMPLES

Example 1

A thin film platinum (Pt) pattern was formed on an n-Si (111) substrate using photolithography. The Pt film pattern was made as a stripe pattern such as shown in FIGS. 2(*a*) and 2(*b*). The thickness of the Pt film was 5 nm±0.9 nm; the pattern of the Pt film was allowed to have a period of 200 μm; and the Pt film having a straight line shape was formed with a line width of 2.0 μm±0.5 μm. After the substrate was transferred to an ultrahigh vacuum chamber, activated nitrogen excited by high-frequency plasma was radiated onto the substrate surface at a substrate temperature of 400° C. for 10 minutes and at 800° C. for 3 minutes. Subsequently, at a growth temperature of 770° C., activated nitrogen excited by radiated high-frequency plasma and gallium were simultaneously radiated, so as to grow a fine columnar crystal of gallium nitride (GaN) for one hour. The growth condition at this time was set to be a condition such that an effective supply amount ratio of activated nitrogen was set to be larger as compared with gallium so as to grow the columnar crystal.

Figure 4:
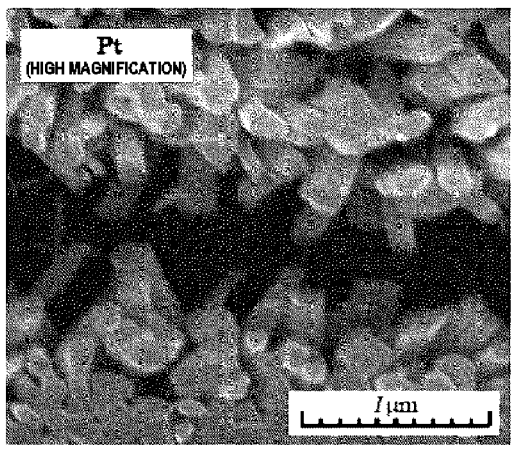
FIG. 4 is a view showing an SEM image of a GaN fine columnar crystal that has grown on a silicon substrate on which a Pt film is formed.
Figure 4:
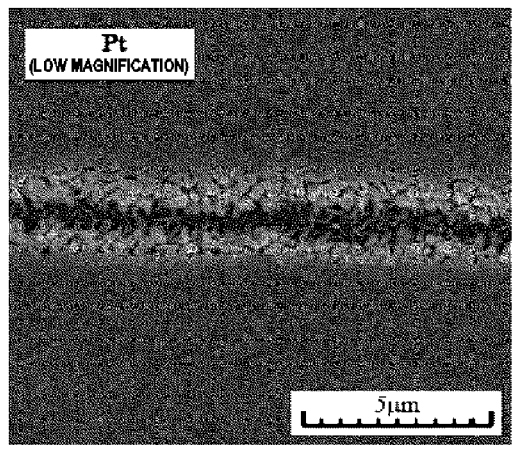

FIGS. 4(*a*) and 4(*b*) are views showing an SEM image of the substrate surface after the GaN fine columnar crystal was grown. At the central part of the Figure, the presence of a region in which the GaN fine columnar crystal was not grown could be confirmed in a straight line shape. In such a region, the Pt film was formed, and it is understood that the Pt film pattern functioned as a suppressing region of the fine columnar crystal. In the present Example, in the growth of the fine columnar crystal, the Pt film pattern having a stripe shape was transcribed, whereby the GaN fine columnar crystal could be grown selectively on the silicon substrate.

Further, the shape of the obtained fine columnar crystal was evaluated.

The fine columnar crystal grew selectively on the silicon substrate with the growth suppressing region on the Pt film. At the boundary part between the Si substrate and the Pt film, it was confirmed that the fine columnar crystal grew in an oblique direction. The height of the formed fine columnar crystal was 1400 nm in average. Also, the diameter of the formed fine columnar crystal was 150 nm in average.

Example 2

A GaN fine columnar crystal was grown in the same manner as in Example 1 except that nickel (Ni) was used as the metal film.

Figure 5:
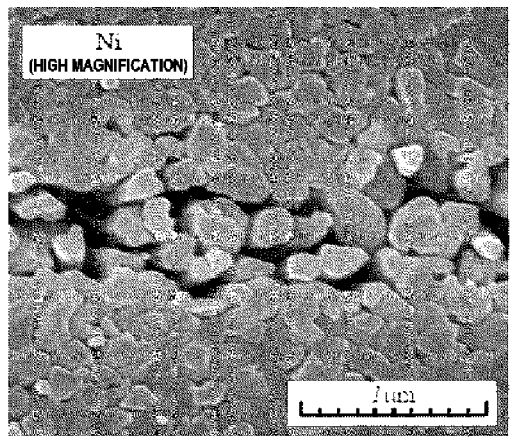
FIG. 5 is a view showing an SEM image of a GaN fine columnar crystal that has grown on a silicon substrate on which a Ni film is formed.
Figure 5:
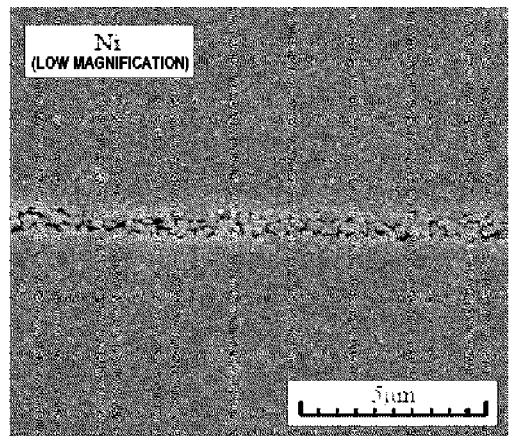

FIGS. 5(a) and 5(b) are views showing an SEM image of the substrate surface after the GaN fine columnar crystal was grown. In the present Example, the fine columnar crystal grew also on the Ni film. The surface occupancy ratio of the fine columnar crystal on the Ni film was lower than the surface occupancy ratio of the fine columnar crystal on the silicon substrate, and the crystals were formed coarsely. Also, the growth of the fine columnar crystal was suppressed along the pattern of the Ni film, whereby the position and shape control of the GaN fine columnar crystal was achieved.

The surface occupancy ratio of the GaN fine columnar crystal on the silicon substrate was about 1.2 to 1.9 times as large as the surface occupancy ratio on the Ni film, as determined by the SEM image, though there were some variations. Also, the diameter of the formed fine columnar crystal was 200 nm in average.

Example 3

A GaN fine columnar crystal was grown in the same manner as in Example 1 except that gold (Au) was used as the metal film.

Figure 6:
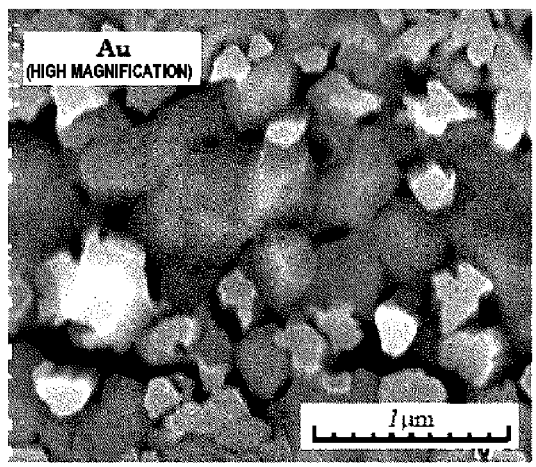
FIG. 6 is a view showing an SEM image of a GaN fine columnar crystal that has grown on a silicon substrate on which an Au film is formed.
Figure 6:
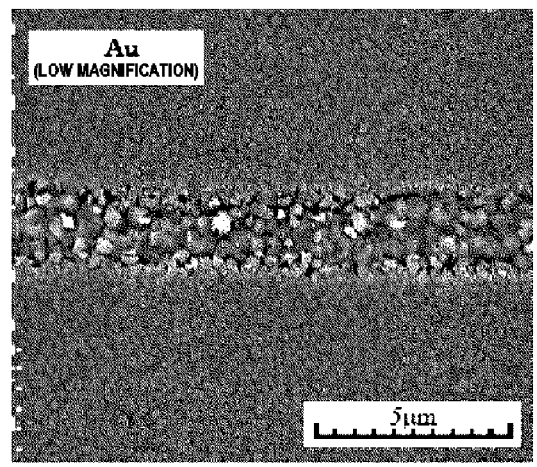

FIGS. 6(a) and 6(b) are views showing an SEM image of the substrate surface after the GaN fine columnar crystal was grown. In the present Example, the fine columnar crystal grew also on the Au film. The height of the fine columnar crystal formed on the Au film was lower than the height of the fine columnar crystal formed on the silicon substrate. The growth of the fine columnar crystal was suppressed along the pattern of the Al film, whereby the position and shape control of the GaN fine columnar crystal was achieved.

The fine columnar crystal formed on the silicon substrate had an elongated shape extending upwards, and the diameter thereof was 200 nm in average. Many of the fine columnar crystals formed on the Au film had a grain shape, and the diameter was 400 nm in average.

Example 4

Figure 3:
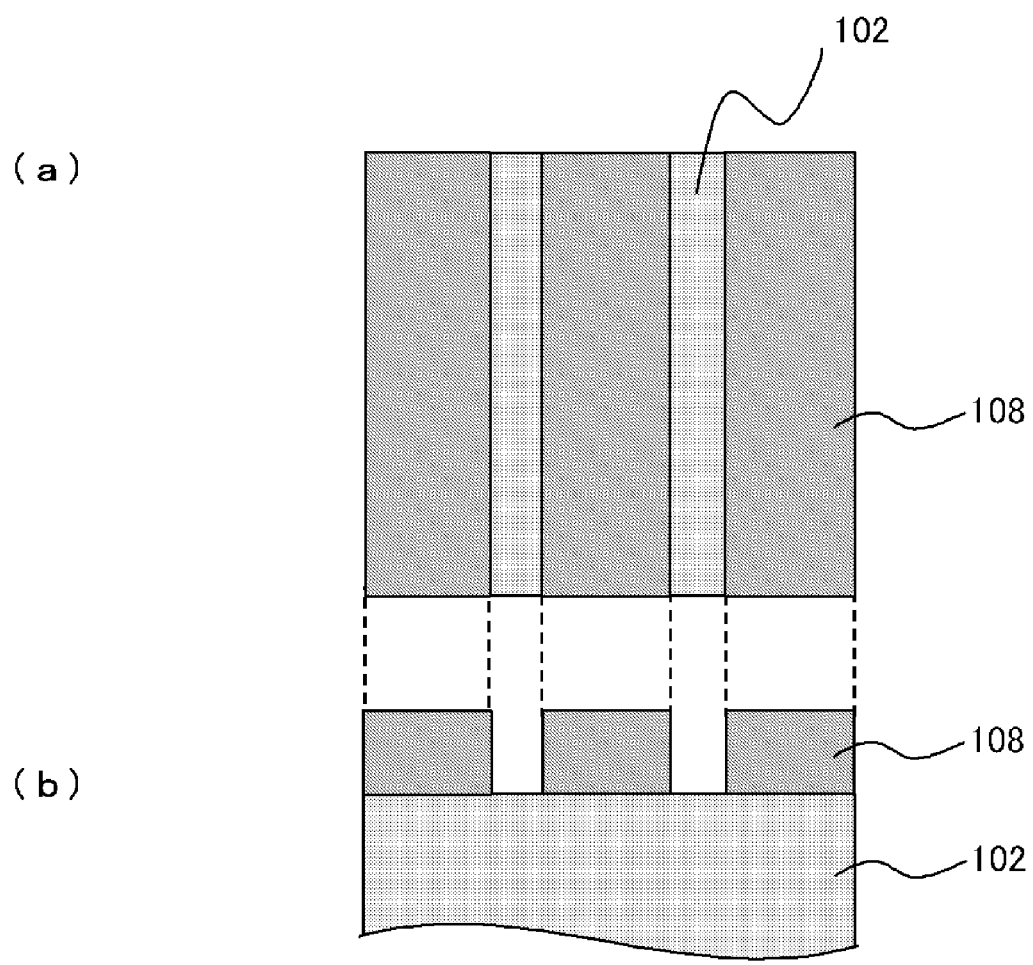
FIG. 3(a) is a plan view and FIG. 3(b) is a cross-sectional view showing an example of a metal film pattern.

A GaN fine columnar crystal was grown in the same manner as in Example 1 except that titanium (Ti) was used as the metal film, and the metal film pattern was set to be an inverted pattern of Example 1. Specifically, the Ti film pattern was set to be a pattern such that slits were formed in a stripe shape on the Ti film, as shown in FIGS. 3(a) and 3(b). The Ti film had a thickness of 4 nm±0.8 nm, and the pattern of the Ti film was such that the slits were formed between the Ti films with a period of 200 μm, and the line width of the exposed silicon substrate surface was 1.7 μm±0.4 μm.

Figure 7:
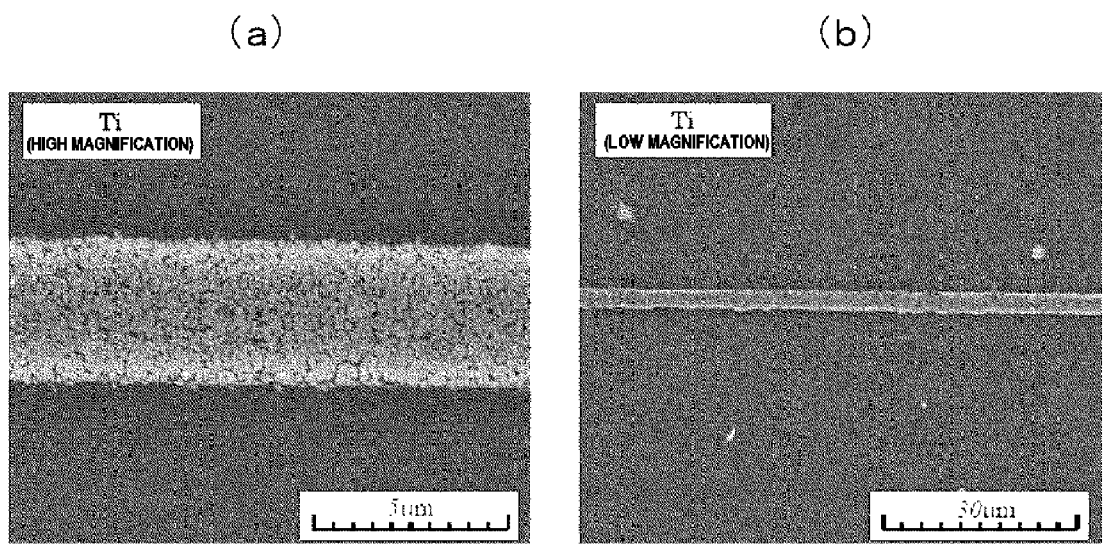
FIG. 7 is a view showing an SEM image of a GaN fine columnar crystal that has grown on a silicon substrate on which a Ti film is formed.

FIGS. 7(a) and 7(b) are views showing an SEM image of the substrate surface after the GaN fine columnar crystal was grown. At the central part of the Figure, it was confirmed that the GaN fine columnar crystal grew in a straight line shape. Such a region was a slit part formed on the Ti film, and the fine columnar crystal grew selectively on the exposed surface of the silicon substrate. In the present Example, the fine columnar crystal could be grown selectively on the silicon substrate, and the growth suppression of the GaN fine columnar crystal by the Ti film could be achieved.

Further, the shape of the obtained fine columnar crystal was evaluated.

The fine columnar crystal grew selectively on the silicon substrate, while the region on the Ti film is the growth suppressing. At the boundary region between the Si substrate and the Ti film, it was confirmed that the fine columnar crystal grew in an oblique direction. An extremely good selectivity was confirmed such that GaN grew little on the Ti film. At the boundary part between the stripe-shaped opening region and the silicon substrate, a transition region in which the GaN crystal density gradually decreases was not seen, so that the selectivity appeared sharply. The height of the formed fine columnar crystal was 1400 nm in average. Also, the diameter of the formed fine columnar crystal was 120 nm in average.

Example 5

Figure 8:
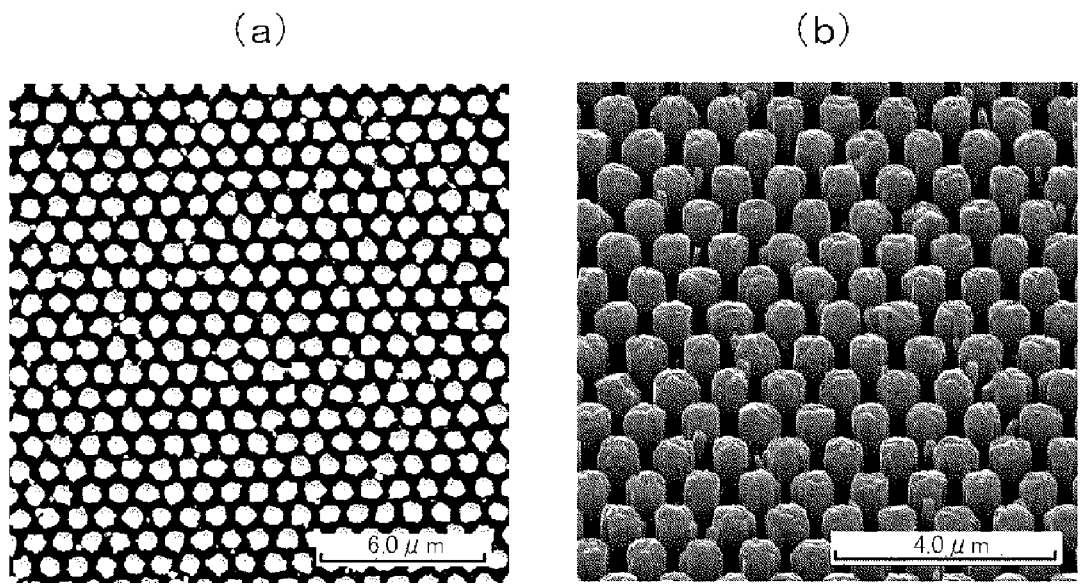
FIG. 8 is a view showing an SEM image of a GaN fine columnar crystal that has been grown after a hole pattern of the thin film Ti is formed on a silicon substrate, where

A Ti film was formed on the surface of an n-type (111) surface silicon substrate. A hole pattern having a dot shape with a diameter of about 400 nm was formed in a triangular lattice shape with an interval of about 1000 nm on the Ti film. FIGS. 8(a) and 8(b) are an example in which a GaN crystal was grown in the opening thereof. FIG. 8(a) is an electron microscope image obtained by observation of the grown GaN fine columnar crystal from immediately above, and FIG. 8(b) is an electron microscope image obtained by observation from obliquely above. The GaN fine columnar crystal grew selectively in the hole part, and the arrangement control was carried out.

In the present Example, selective growth of the GaN fine columnar crystal of a high degree could be realized by forming a fine opening pattern in the Ti pattern. Also, the diameter of the fine columnar crystal formed in the hole part was 650 nm in average.

Example 6

Figure 9:
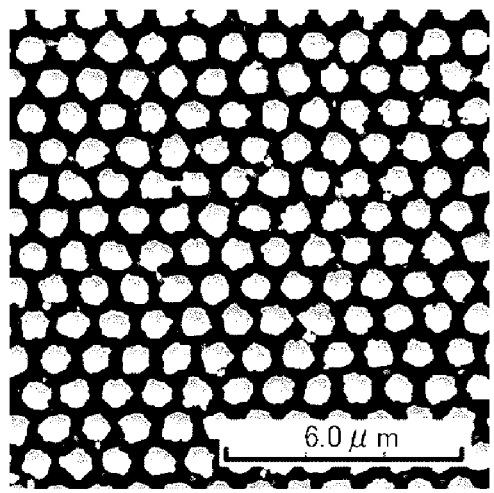
FIG. 9 is a view showing an SEM image of a GaN fine columnar crystal that has been grown after a hole pattern of the thin film Ti is formed on a silicon substrate, where
Figure 9:
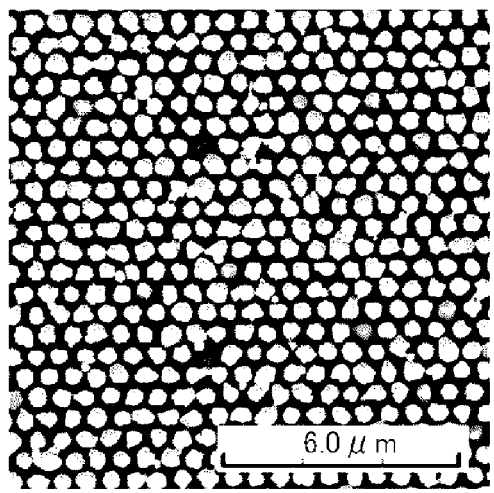
Figure 9:
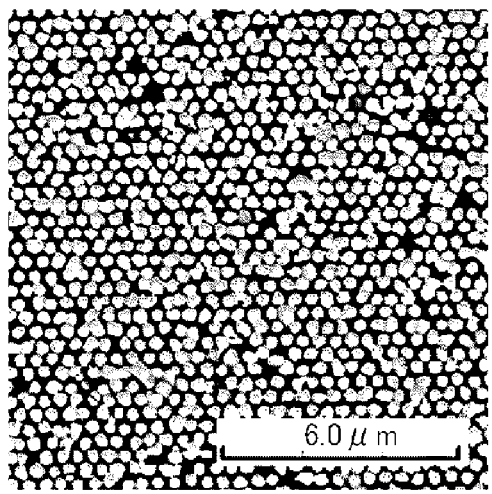
Figure 9:
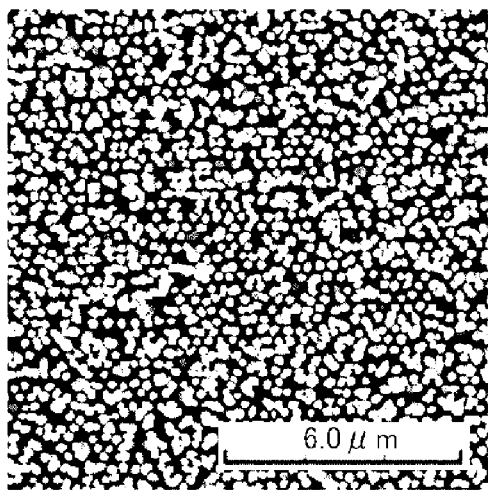

A Ti film having a dot-shaped hole pattern was formed on the surface of an n-type (111) surface silicon substrate. A GaN fine columnar crystal was grown thereon by changing the hole interval respectively to about 1000 nm, about 600 nm, about 400 nm, and about 300 nm, and changing the diameter of the dots to about 500 nm, about 350 nm, about 200 nm, and about 60 nm. FIG. 9 is an electron microscope image obtained by observation of the grown GaN fine columnar crystal from immediately above, where FIG. 9(a) is a case with a hole interval of 1000 nm; FIG. 9(b) is a case with 600 nm; FIG. 9(c) is a case with 400 nm; and FIG. 9(d) is a case with 300 nm. Since the hole interval and the diameter of the hole were small, the diameter of the GaN fine columnar crystal was highly controlled. Also, in the case of (d), the diameter of the fine columnar crystal formed in the holes was 220 nm in average.

The present Example can be used for control of the arrangement and the shape of a III nitride semiconductor superfine columnar crystal.

Example 7

An opening pattern having a stripe shape with a width of about 800 nm was formed on an n-type (111) silicon substrate with use of Ti as a metal film by electron beam lithography and the lift-off method. Thereafter, GaN was grown by the same method as in Example 1.

FIG. 10 is an electron microscope image after GaN was grown, where FIG. 10(a) is an image by observation from immediately above, and FIG. 10(b) is an image by observation from obliquely above. A wall-shaped fine columnar crystal grew on the substrate surface where the Ti film had not been formed. The height of the grown wall-shaped fine columnar crystal was about 1600 nm in average.

The crystal growth was suppressed on the Ti film, and the wall-shaped crystal could be grown along the pattern of the opening.

FIG. 11(a) is a case in which the width of the stripe-shaped opening pattern was set to be about 120 nm, where GaN fine columnar crystals having a diameter of 100 nm or less were arranged in a line.

Example 8

A GaN template in which a GaN film was grown to 7 µm on a sapphire substrate was used as a substrate. After a Ti thin film having a thickness of about 18 nm was formed on the GaN template surface, a resist was applied, and a stripe pattern having an opening width of about 100 nm to 300 nm was formed by using electron beam lithography and the dry etching method. Thereafter, GaN was grown.

A wall-shaped fine columnar crystal grew on the substrate surface where the Ti film had not been formed. FIG. 12 shows an SEM image of the grown wall-shaped fine columnar crystal. The height of the wall-shaped fine columnar crystal was about 300 nm in average. The wall surface of the wall-shaped crystal was formed with a crystal face of a stable face direction, so that a GaN wall-shaped crystal having an extremely good crystallinity was formed by using a GaN template as the substrate. The width of the wall-shaped fine columnar crystal (plate-shaped single crystal) was about 175 nm in average.

Example 9

A pattern of a thin film Ti was formed using a GaN template as a substrate in the same manner as in Example 8. The pattern shape was set to be a hexagonal ring resonator shape with an opening width of about 100 nm to 300 nm. Thereafter, GaN was grown.

A wall-shaped fine columnar crystal grew on the substrate surface where the Ti film had not been formed. FIG. 13 shows an SEM image of the grown wall-shaped fine columnar crystal. The height of the wall-shaped fine columnar crystal was about 900 nm in average. The width of the wall-shaped fine columnar crystal was about 390 nm in average.

FIG. 14 is a view showing an electron microscope image when an opening pattern of a Ti thin film in a mesh form was formed on a GaN template by the same method as that described above and GaN was grown thereafter. Mesh-shaped GaN having fine holes with a diameter of about 100 to 300 nm could be grown.

In the present Example, selective growth of a GaN fine columnar crystal of a high degree could be realized by forming a fine opening pattern in the Ti pattern. On the Ti film, the crystal growth was suppressed, and the wall-shaped crystal could be grown along the pattern of the opening. The width of the wall-shaped fine columnar crystal was 110 nm in average.

Here, in the above embodiment, Ti, Pt, Au, and Ni were used as the metal film; however, the present invention is not limited thereto, so that other metal films may produce the same effects as well. For example, the same effects may be produced even by using Ta, Fe, Co, W, or the like.

Further, the same effects may be produced even by using a titanium oxide film instead of the Ti film.

The invention claimed is:

1. A III nitride structure comprising:
a film having a surface composed of a metal formed in a predetermined region on the surface of a substrate;
a first fine columnar crystal composed of a III nitride semiconductor formed on the surface of said substrate where said film is not formed; and
a second fine columnar crystal composed of a III nitride semiconductor formed on said film,
wherein a spatial occupancy ratio of said second fine columnar crystal is lower than a spatial occupancy ratio of said first fine columnar crystal, and
a thickness of said film perpendicular to said surface of said substrate is 2 nm or more and 100 nm or less.

2. The III nitride structure as claimed in claim 1, having a wall shape in which a plurality of said first fine columnar crystals are arranged and disposed in one direction on the surface of said substrate where said film is not formed.

3. The III nitride structure as claimed in claim 1, wherein said first fine columnar crystal has a wall shape extending in one direction in a top view on the surface of said substrate where said film is not formed.

4. The III nitride structure as claimed in claim 1, wherein the surface of said substrate is a layer containing silicon, and said metal is one kind of metal or two or more kinds of metals selected from the group consisting of Ti, Ta, Fe, Ni, Co, and W.

5. The III nitride structure as claimed in claim 1, wherein said film is formed with a predetermined pattern in a stripe shape.

6. The III nitride structure as claimed in claim 1, wherein said first fine columnar crystal has a diameter of 1000 nm or less, or said first fine columnar crystal extends in one direction and the width perpendicular to the extending direction is 800 nm or less.

7. The III nitride structure as claimed in claim 1, wherein said second fine columnar crystal is composed of a III nitride semiconductor and has a smaller height than said first fine columnar crystal.

8. A III nitride structure comprising:
a film having a surface composed of a metal formed in a predetermined region on the surface of a substrate; and
a plurality of fine columnar crystal composed of at least a III nitride semiconductor formed on the surface of said substrate,
wherein the spatial occupancy ratio of said plurality of fine columnar crystal on the surface of the substrate where the film is not formed is higher than that on said film, and
a thickness of said film perpendicular to said surface of said substrate is 2 nm or more and 100 nm or less,
wherein said III nitride structure has a wall shape in which said plurality of fine columnar crystals are arranged and disposed in one direction on the surface of said substrate where said film is not formed.

9. The III nitride structure as claimed in claim 8, wherein the surface of said substrate is a layer containing silicon, and said metal is one kind of metal or two or more kinds of metals selected from the group consisting of Ti, Ta, Fe, Ni, Co, and W.

10. The III nitride structure as claimed in claim 6, wherein said film is formed with a predetermined pattern in a stripe shape.

11. The III nitride structure as claimed in claim 8, wherein said plurality of fine columnar crystals each have a diameter of 1000 nm or less.

12. A III nitride structure comprising:
a film having a surface composed of a metal formed in a predetermined region on the surface of a substrate; and
a fine columnar crystal composed of at least a III nitride semiconductor formed on the surface of said substrate,
wherein the spatial occupancy ratio of said fine columnar crystal on the surface of the substrate where the film is not formed is higher than that on said film, and
a thickness of said film perpendicular to said surface of said substrate is 2 nm or more and 100 nm or less, wherein said fine columnar crystal has a wall shape extending in one direction in a top view on the surface of said substrate where said film is not formed.

13. The III nitride structure as claimed in claim 12, wherein the surface of said substrate is a layer containing silicon, and said metal is one kind of metal or two or more kinds of metals selected from the group consisting of Ti, Ta, Fe, Ni, Co, and W.

14. The III nitride structure as claimed in claim 12, wherein said film is formed with a predetermined pattern in a stripe shape.

15. The III nitride structure as claimed in claim 12, wherein said fine columnar crystal extends in one direction and a width perpendicular to the extending direction is 800 nm or less.

16. A III nitride structure comprising:
a film having a surface composed of a metal formed in a predetermined region on the surface of a substrate; and
a fine columnar crystal composed of at least a III nitride semiconductor formed on the surface of said substrate,
wherein the spatial occupancy ratio of said fine columnar crystal on the surface of the substrate where the film is not formed is higher than that on said film, and
a thickness of said film perpendicular to said surface of said substrate is 2 nm or more and 100 nm or less,
wherein said film is formed with a predetermined pattern in a stripe shape.

17. The III nitride structure as claimed in claim 16, wherein the surface of said substrate is a layer containing silicon, and said metal is one kind of metal or two or more kinds of metals selected from the group consisting of Ti, Ta, Fe, Ni, Co, and W.

18. The III nitride structure as claimed in claim 16, wherein said fine columnar crystal has a diameter of 1000 nm or less, or said fine columnar crystal extends in one direction and a width perpendicular to the extending direction is 800 nm or less.

19. A III nitride structure comprising:
a film having a surface composed of a metal formed in a predetermined region on the surface of a substrate; and
a fine columnar crystal composed of at least a III nitride semiconductor formed on the surface of said substrate,
wherein the spatial occupancy ratio of said fine columnar crystal on the surface of the substrate where the film is not formed is higher than that on said film, and
a thickness of said film perpendicular to said surface of said substrate is 2 nm or more and 100 nm or less,
wherein said fine columnar crystal has a diameter of 1000 nm or less, or
said fine columnar crystal extends in one direction and the width perpendicular to the extending direction is 800 nm or less.

20. The III nitride structure as claimed in claim 19, wherein the surface of said substrate is a layer containing silicon, and said metal is one kind of metal or two or more kinds of metals selected from the group consisting of Ti, Ta, Fe, Ni, Co, and W.

21. A method for manufacturing a fine columnar crystal comprising:
forming a film having a surface made of a metal in a predetermined region on a surface of a substrate, and
growing a fine columnar crystal made of a III nitride semiconductor at least on the surface of said substrate where said film is not formed, by introducing a growth source material to the surface of said substrate and, assuming the region on said film to be a growth suppressing region, suppressing the growth of the fine columnar crystal made of the III nitride semiconductor on said growth suppressing region,
a thickness of said film perpendicular to said surface of said substrate is 2 nm or more and 100 nm or less.

22. The method for manufacturing a fine columnar crystal as claimed in claim 21, wherein said fine columnar crystal is not grown on said growth suppressing region in said growing the fine columnar crystal.

23. The method for manufacturing a fine columnar crystal as claimed in claim 21, wherein said growing the fine columnar crystal includes:
growing a first fine columnar crystal composed of the III nitride semiconductor on the surface of said substrate where said film is not formed; and
growing a second fine columnar crystal composed of the III nitride semiconductor on said growth suppressing region, the spatial occupancy ratio of said second fine columnar crystal composed of the III nitride semiconductor on said growth suppressing region being lower than the spatial occupancy ratio of said first fine columnar crystal on said growth promoting region.

24. The method for manufacturing a fine columnar crystal as claimed in claim 21, wherein said growing the fine columnar crystal includes:
growing a first fine columnar crystal composed of the III nitride semiconductor on the surface of said substrate where said film is not formed; and
growing a second fine columnar crystal composed of the III nitride semiconductor on said growth suppressing region, the second fine columnar crystal having a lower height than said first fine columnar crystal.

25. The method for manufacturing a fine columnar crystal as claimed in claim 21, wherein said fine columnar crystal is formed in a wall shape on the surface of said substrate on which said film is not formed, in said growing the fine columnar crystal.

26. The method for manufacturing a fine columnar crystal as claimed in claim 21, wherein the fine columnar crystal made of the III nitride semiconductor is formed by a molecular beam epitaxy method (MBE) in said growing the fine columnar crystal.

27. The method for manufacturing a fine columnar crystal as claimed in claim 26, wherein the temperature of growing the fine columnar crystal by the molecular beam epitaxy method is set to be 350° C. or higher and 1200° C. or lower in said growing the fine columnar crystal.

28. The method for manufacturing a fine columnar crystal as claimed in claim 21, wherein activated nitrogen excited by a high-frequency plasma is used as a nitrogen source in said growing the fine columnar crystal.

29. The method for manufacturing a fine columnar crystal as claimed in claim 21, wherein said metal is one kind of metal or two or more kinds of metals selected from the group consisting of Ti, Ta, Fe, Ni, Pt, Au, Co, and W.

* * * * *

UNITED STATES PATENT AND TRADEMARK OFFICE
CERTIFICATE OF CORRECTION

PATENT NO. : 8,896,100 B2  Page 1 of 1
APPLICATION NO. : 12/676061
DATED : November 25, 2014
INVENTOR(S) : Katsumi Kishino and Akihiko Kikuchi It is certified that error appears in the above-identified patent and that said Letters Patent is hereby corrected as shown below:

In the Claims

Column 14, Line 52: In Claim 10, after "claim" delete "6" and insert --8--.

Signed and Sealed this
Seventh Day of April, 2015

Michelle K. Lee
*Director of the United States Patent and Trademark Office*